United States Patent
Hsieh et al.

(10) Patent No.: US 11,373,692 B2
(45) Date of Patent: *Jun. 28, 2022

(54) DELAY TRACKING METHOD AND MEMORY SYSTEM

(71) Applicant: MediaTek Inc., Hsin-Chu (TW)

(72) Inventors: Bo-Wei Hsieh, Hsinchu (TW); Chia-Yu Chan, Hsinchu (TW); Jou-Ling Chen, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/180,554

(22) Filed: Feb. 19, 2021

(65) Prior Publication Data

US 2021/0174851 A1    Jun. 10, 2021

Related U.S. Application Data

(63) Continuation of application No. 16/540,156, filed on Aug. 14, 2019, now Pat. No. 10,964,363.

(60) Provisional application No. 62/718,535, filed on Aug. 14, 2018.

(51) Int. Cl.
   *G11C 7/00* (2006.01)
   *G11C 7/22* (2006.01)
   *G11C 7/10* (2006.01)

(52) U.S. Cl.
   CPC ............ *G11C 7/222* (2013.01); *G11C 7/1078* (2013.01); *G11C 2207/2227* (2013.01); *G11C 2207/2272* (2013.01)

(58) Field of Classification Search
   CPC ............ G11C 11/4099; G11C 11/4076; G11C 11/4093; G11C 11/4096; G06F 13/1621

USPC .................................................. 365/189.011
See application file for complete search history.

(56) References Cited

U.S. PATENT DOCUMENTS

| | | | |
|---|---|---|---|
| 7,257,035 B2 * | 8/2007 | Hsieh | G11C 11/4072 365/191 |
| 7,280,419 B1 | 10/2007 | Cheng | |
| 9,018,980 B1 | 4/2015 | Durairajan et al. | |
| 9,613,665 B2 * | 4/2017 | Chen | G11C 7/222 |
| 9,722,588 B1 | 8/2017 | Shibata et al. | |
| 9,811,273 B1 | 11/2017 | Durairajan et al. | |
| 10,109,341 B2 * | 10/2018 | Hsieh | G11C 11/4072 |
| 10,141,044 B2 | 11/2018 | Chen et al. | |
| 10,163,485 B2 * | 12/2018 | Chen | G11C 29/022 |
| 10,438,650 B1 | 10/2019 | Yamashita et al. | |
| 10,642,538 B1 | 5/2020 | MacLaren et al. | |
| 10,964,363 B2 * | 3/2021 | Hsieh | G11C 7/1078 |
| 2003/0235107 A1 | 12/2003 | Jang | |
| 2004/0022118 A1 | 2/2004 | Kim | |

(Continued)

FOREIGN PATENT DOCUMENTS

CN        107924693 A        4/2018

*Primary Examiner* — Viet Q Nguyen
(74) *Attorney, Agent, or Firm* — Wolf, Greenfield & Sacks, P.C.

(57) ABSTRACT

A delay tracking method and a memory system are provided. The delay tracking method is applied to a memory system supporting a low-frequency-mode (LFM) and a high-frequency-mode (HFM) of an operating clock. The delay tracking method includes the steps of selecting a LFM oscillator for obtaining a LFM delay value when the operating clock is in the HFM; and selecting a HFM oscillator for obtaining a HFM delay value when the operating clock is in the LFM.

20 Claims, 2 Drawing Sheets

(56) References Cited

U.S. PATENT DOCUMENTS

| | | | |
|---|---|---|---|
| 2008/0080267 A1 | 4/2008 | Lee | |
| 2009/0327553 A1 | 12/2009 | Fletcher | |
| 2010/0118626 A1* | 5/2010 | Maeda | H03L 7/07 |
| | | | 365/193 |
| 2010/0202223 A1* | 8/2010 | Kuroki | G11C 7/222 |
| | | | 365/193 |
| 2011/0001526 A1* | 1/2011 | Hong | H03L 7/0816 |
| | | | 327/158 |
| 2011/0103533 A1 | 5/2011 | Conway | |
| 2011/0251819 A1 | 10/2011 | Ong | |
| 2012/0274373 A1 | 11/2012 | Ku | |
| 2013/0028034 A1* | 1/2013 | Fujisawa | G11C 11/4093 |
| | | | 365/194 |
| 2013/0031305 A1* | 1/2013 | Fujisawa | G11C 29/028 |
| | | | 711/106 |
| 2014/0013138 A1 | 1/2014 | Kanai et al. | |
| 2015/0235691 A1* | 8/2015 | Kwak | G11C 11/4076 |
| | | | 365/194 |
| 2017/0063384 A1* | 3/2017 | Chi | H03L 7/0812 |
| 2017/0324399 A1* | 11/2017 | Kanzaki | H03K 3/012 |
| 2018/0122440 A1 | 5/2018 | Manning et al. | |
| 2018/0226120 A1* | 8/2018 | Ellis | G11C 11/4074 |
| 2019/0036531 A1 | 1/2019 | Bains et al. | |
| 2019/0043538 A1 | 2/2019 | Hollis | |
| 2019/0066740 A1 | 2/2019 | Prakash et al. | |
| 2019/0163228 A1 | 5/2019 | Gupta et al. | |
| 2019/0172512 A1 | 6/2019 | Oh et al. | |
| 2019/0189194 A1 | 6/2019 | Kim et al. | |
| 2020/0058335 A1 | 2/2020 | Hsieh et al. | |

* cited by examiner

DELAY TRACKING METHOD AND MEMORY SYSTEM

CROSS REFERENCE TO RELATED APPLICATIONS

This Application is a Continuation of U.S. application Ser. No. 16/540,156, filed Aug. 14, 2019, titled "DELAY TRACKING METHOD AND MEMORY SYSTEM", which claims the benefit under 35 U.S.C. § 119(e) of U.S. Provisional Application Ser. No. 62/718,535 and filed Aug. 14, 2018. The entire contents of these applications are incorporated herein by reference in their entirety.

BACKGROUND OF THE INVENTION

Field of the Invention

The invention generally relates to a wireless communication technology, and more particularly, to the delay tracking for fifth-generation low-power DDR (LPDDR5) technology.

Description of the Related Art

In the current fifth-generation low-power DDR (LPDDR5) standard, a WCK2DQI oscillator (i.e. writing oscillator) is introduced for delay tracking in writing operations, and a WCK2DQO oscillator (i.e. reading oscillator) is introduced for delay tracking in reading operations. In addition, in the current LPDDR5 standard, a multipurpose command (MPC) is used to enable or disable the WCK2DQI oscillator or the WCK2DQO oscillator. Furthermore, in the current LPDDR5 standard, different frequency modes are introduced to save power.

However, in the current LPDDR5 standard, how to efficiently use the WCK2DQI oscillator or WCK2DQO oscillator for delay tracking in different frequency modes is not specified.

BRIEF SUMMARY OF THE INVENTION

A delay tracking method and a memory system are provided to overcome the problems mentioned above.

An embodiment of the invention provides a delay tracking method. The delay tracking method is applied to a memory system supporting a low-frequency-mode (LFM) and a high-frequency-mode (HFM) of an operating clock. The delay tracking method includes the steps of selecting a LFM oscillator for obtaining a LFM delay value when the operating clock is in the HFM; and selecting a HFM oscillator for obtaining a HFM delay value when the operating clock is in the LFM.

In some embodiments, the LFM delay value is obtained before the operating clock is switched from the HFM to the LFM. In an embodiment, the LFM delay value is obtained by periodically enabling the LFM oscillator. In another embodiment, the LFM delay value is obtained by aperiodically enabling the LFM oscillator. The LFM delay value is applied for a LFM delay tracking when the operating clock is in the LFM.

In some embodiments, the HFM delay value is obtained before the operating clock is switched from the LFM to the HFM. In an embodiment, the HFM delay value is obtained by periodically enabling the HFM oscillator. In another embodiment, the HFM delay value is obtained by aperiodically enabling the HFM oscillator. The HFM delay value is applied for a HFM delay tracking when the operating clock is in the HFM.

In some embodiments, the LFM oscillator and the HFM oscillator are selected via Multipurpose Command (MPC) command or Mode Register Operand (MR OP).

An embodiment of the invention provides a memory system. The memory system comprises a memory controller and a memory device. The memory controller generates a command. The memory device comprises a low-frequency-mode (LFM) oscillator, and a high-frequency-mode (HFM) oscillator. The memory device receives the command from the memory controller to select the LFM oscillator or the HFM oscillator. The LFM oscillator is selected for obtaining a LFM delay value, when the operating clock is in the HFM. The HFM oscillator is selected for obtaining a HFM delay value, when the operating clock is in the LFM.

Other aspects and features of the invention will become apparent to those with ordinary skill in the art upon review of the following descriptions of specific embodiments of delay tracking method and the memory system.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
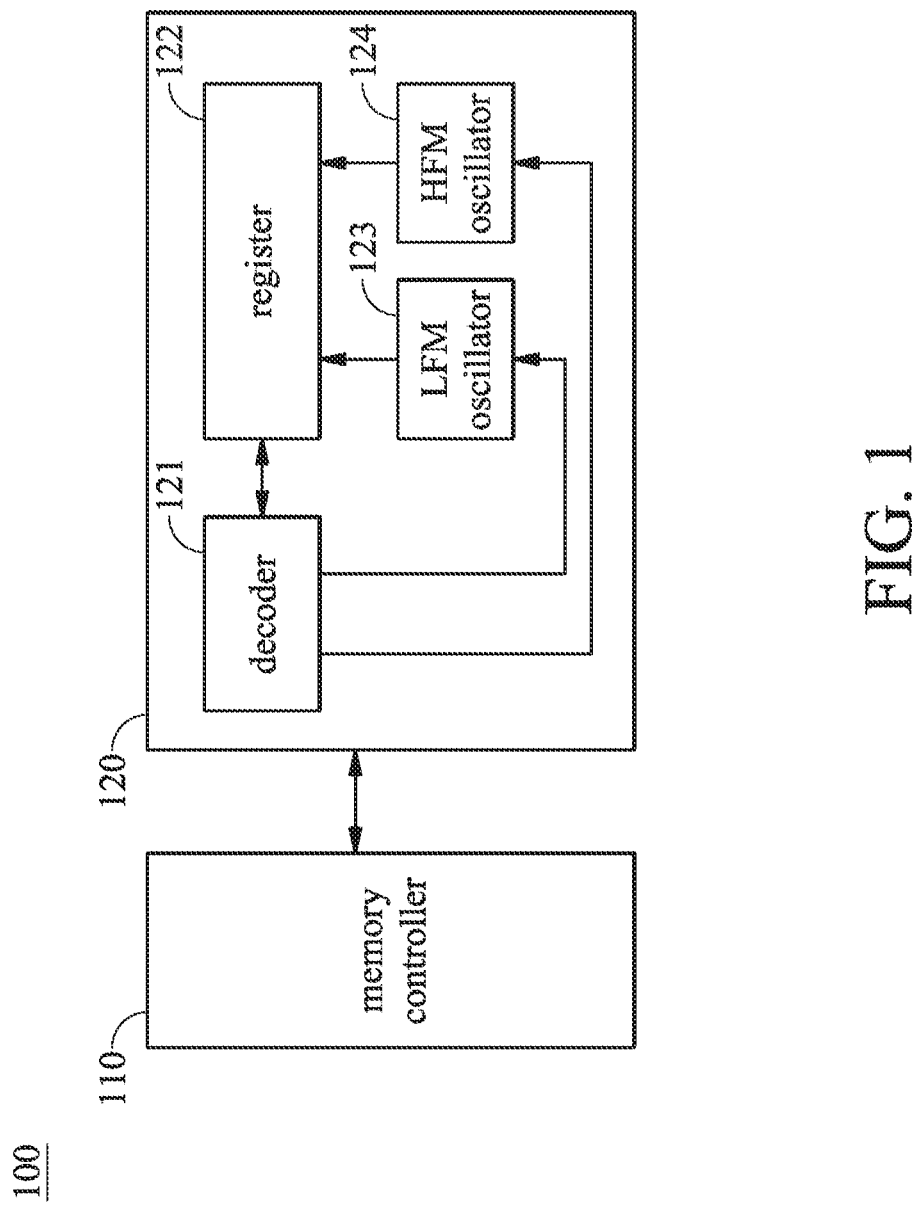
FIG. 1 is a block diagram of a memory system 100 according to an embodiment of the invention.

FIG. 1 is a block diagram of a memory system 100 according to an embodiment of the invention. The memory system 100 may support a low-frequency-mode (LFM) and a high-frequency-mode (HFM), i.e. an operating clock of the memory system 100 may be in the LFM or HFM. The memory system 100 may comprise a memory controller 110 and a memory device 120. In the embodiments of the invention, the memory system 100 can be applied to the fifth-generation low-power DDR (LPDDR5) technology. It should be noted that, in order to clarify the concept of the invention, FIG. 1 is a simplified block diagram in which only the elements relevant to the invention are shown. However, the invention should not be limited to what is shown in FIG. 1.

In an embodiment of the invention, the memory device 120 may be a dynamic random access memory (DRAM) device. As shown in FIG. 1, the memory device 120 may comprise a decoder 121, a register 122, a low-frequency-mode (LFM) oscillator 123, and a high-frequency-mode (HFM) oscillator 124. It should be noted that, in order to clarify the concept of the invention, the memory device 120 of FIG. 1 is a simplified block diagram in which only the elements relevant to the invention are shown. However, the invention should not be limited to what is shown in FIG. 1. The memory device 120 may also comprise other elements.

In an embodiment of the invention, the memory controller 110 may transmit a clock signal (e.g. a WCK clock in LPDDR5 technology) to the memory device 120 to sample the timing signal for writing operation or reading operation to track the delay in the writing operation or reading operation. The timing signal for writing operation or reading operation may have different frequencies for the low-frequency-mode (LFM) and high-frequency-mode (HFM). The LFM oscillator 123 and the HFM oscillator 124 can be applied for delay tracking in the writing operation or the reading operation. The delay value (or delay parameters) obtained in different frequency modes (i.e. LFM and HFM) are different.

When the LFM oscillator 123 and the HFM oscillator 124 are applied to a writing operation, the LFM oscillator 123 and the HFM oscillator 124 may be regarded as writing oscillators (e.g. WCK2DQI oscillator in LPDDR5 technology), and when the LFM oscillator 123 and the HFM oscillator 124 are applied to a reading operation, the LFM oscillator 123 and the HFM oscillator 124 may be regarded as reading oscillators (e.g. WCK2DQO oscillator in LPDDR5 technology), wherein the writing oscillators and the reading oscillators may not be operated simultaneously. That is to say, the memory device 120 may comprise writing oscillators and reading oscillators, and the writing oscillators may comprise LFM writing oscillator and the HFM writing oscillator and the reading oscillators may comprise LFM reading oscillator and the HFM reading oscillator. However, in order to illustrate simply, there are only one LFM oscillator and one HFM oscillator shown in FIG. 1, but the invention should not be limited to what is shown in FIG. 1. The writing oscillator and the oscillator are applied for delay tracking when the voltage and temperature change on the memory device 120. The memory controller 110 may read the value generated by the writing oscillator or the reading oscillator to determine the delay value.

In an embodiment of the invention, the LFM oscillator 123 and the HFM oscillator 124 may be integrated to an oscillator which can generate oscillation signals with different frequencies to be the LFM oscillator and the HFM oscillator. That is to say, in the embodiment, there are one writing oscillator and one reading oscillator in the memory device 120. The writing oscillator can generate oscillation signals with different frequencies to be the LFM oscillator and the HFM oscillator, and the reading oscillator can also generate oscillation signals with different frequencies to be the LFM oscillator and the HFM oscillator.

In an embodiment of the invention, the memory controller 110 may transmit a command to the memory device 120 to select the LFM oscillator 123 for obtaining a LFM delay value or the HFM oscillator 124 for obtaining a HFM delay value. When the decoder 121 of the memory device 120 receives the command from the memory controller 110, the decoder 121 may decode the command to generate a decode result. The LFM oscillator 123 or the HFM oscillator 124 are selected according to the decode result. According to an embodiment of the invention, the decode result may be a Multipurpose Command (MPC) command or a Mode Register Operand (MR OP). The LFM oscillator 123 or the HFM oscillator 124 may be enabled according to the MPC command or the MR OP in the memory device 120. In addition, according to the decode result, the MPC command or MR OP is further used to drive the LFM oscillator 123 for obtaining a LFM delay value or drive the HFM oscillator 124 for obtaining a HFM delay value. In an embodiment of the invention, the obtained LFM delay value and the HFM delay value may be stored in the register 122. The memory controller 110 may perform a LFM delay tracking or a HFM delay tracking according to the LFM delay value or the HFM delay value stored in the register 122 of the memory device 120.

In an embodiment of the invention, when the LFM oscillator 123 is selected for obtaining the LFM delay value (i.e. the memory device 120 is in the LFM currently or the operating clock is in LFM currently), the HFM oscillator 124 is enabled at the same time to obtain an HFM delay value in advance. That is to say, in the embodiment, although the operating clock is in LFM, the memory controller 110 may also transmit another command to enable the HFM oscillator 124 to obtain an HFM delay value in advance. The HFM delay value may be stored in the register 122. In the embodiment of the invention, the HFM oscillator 124 may be enabled periodically according to the command from the memory controller 110, or the HFM oscillator 124 may be enabled aperiodically according to the command from the memory controller 110. When the memory device 120 is switched from the LFM to the HFM (i.e. the operating clock is switched from the LFM to the HFM), the memory controller 110 will be able to directly use the HFM delay value for HFM delay tracking.

In another embodiment of the invention, when the HFM oscillator 124 is selected for obtaining the HFM delay value (i.e. the memory device 120 is in the HFM currently or the operating clock is in HFM currently), the LFM oscillator 123 is enabled at the same time to obtain an LFM delay value in advance. That is to say, in the embodiment, although the operating clock is in HFM, the memory controller 110 may also transmit another command to enable the LFM oscillator 123 to obtain an LFM delay value in advance. The LFM delay value may be stored in the register 122. In the embodiment of the invention, the LFM oscillator 123 may be enable periodically according to the command from the memory controller 110, or the LFM oscillator 123 may be enabled aperiodically according to the command from the memory controller 110. When the memory device 120 is switched from the HFM to the LFM (i.e. the operating clock is switched from the HFM to the LFM), the memory controller 110 will be able to directly use the LFM delay value for LFM delay tracking.

In another embodiment of the invention, only when the memory device 120 knows that it will be switched from the LFM to the HFM (i.e. the memory device 120 is in the LFM currently or the operating clock is in LFM currently), the HFM oscillator 124 is enabled to obtain an HFM delay value in advance. The HFM delay value may be stored in the register 122. In the embodiment of the invention, the HFM oscillator 124 may be enabled periodically according to a command from the memory controller 110, or the HFM oscillator 124 may be enabled aperiodically according to a command from the memory controller 110. When the memory device 120 has been switched from the LFM to the HFM (i.e. the operating clock is switched from the LFM to the HFM), the memory controller 110 will be able to directly use the HFM delay value for HFM delay tracking.

In another embodiment of the invention, only when the memory device 120 knows that it will be switched from the HFM to the LFM (i.e. the memory device 120 is in the HFM currently or the operating clock is in HFM currently), the LFM oscillator 123 is enabled to obtain LFM delay value in advance. The LFM delay value may be stored in the register 122. In the embodiment of the invention, the LFM oscillator 123 may be enabled periodically according to a command from the memory controller 110, or the LFM oscillator 123 may be enabled aperiodically according to a command from the memory controller 110. When the memory device 120 is switched from the HFM to the LFM (i.e. the operating clock is enabled from the HFM to the LFM), the memory controller 110 will be able to directly use the LFM delay value for LFM delay tracking.

Figure 2:
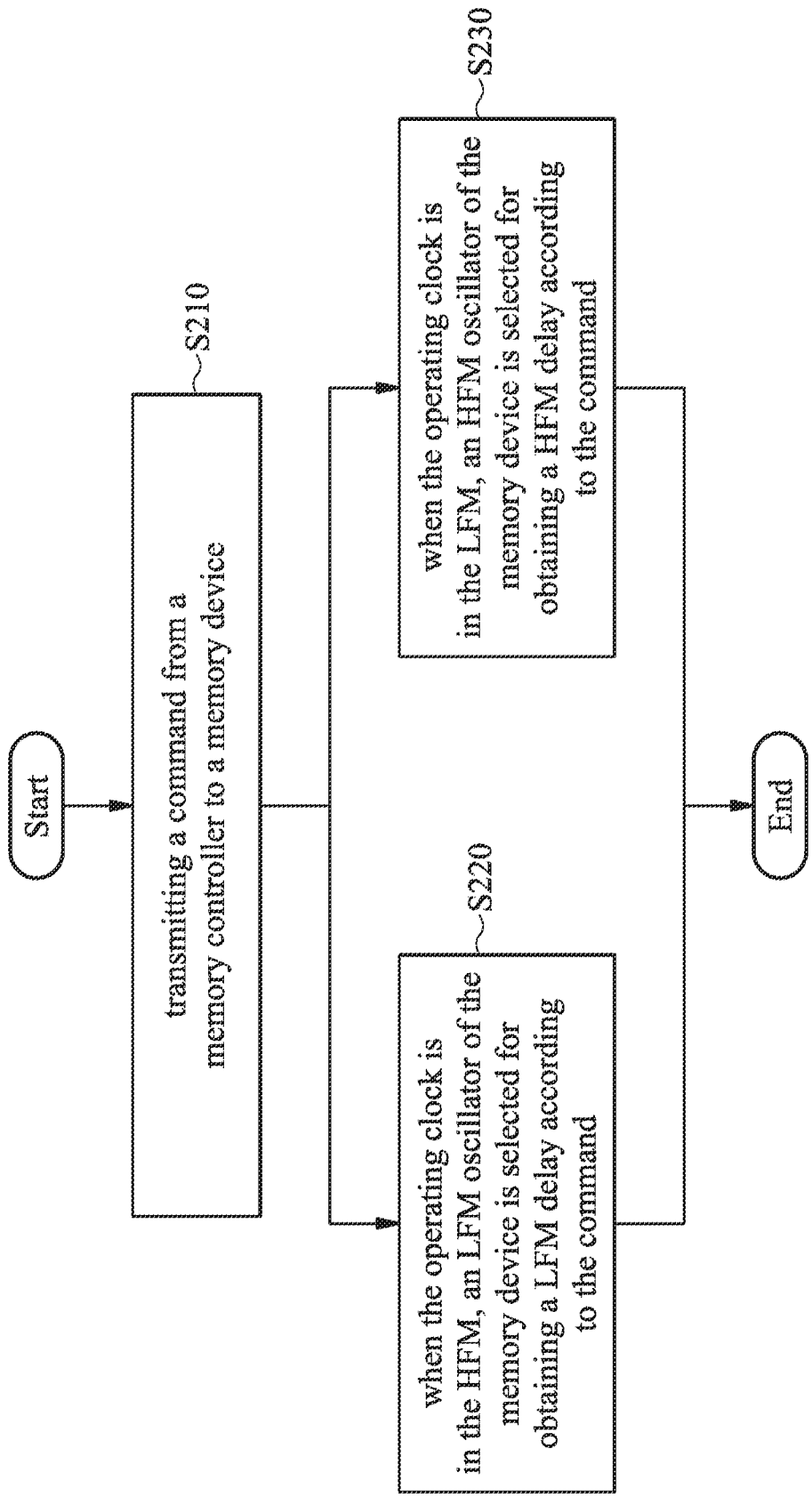
FIG. 2 is a flow chart 200 illustrating a delay tracking method according to an embodiment of the invention.

FIG. 2 is a flow chart 200 illustrating a delay tracking method according to an embodiment of the invention. The delay tracking method can be applied to the memory system 100 which supports a low-frequency-mode (LFM) and a high-frequency-mode (HFM), i.e. an operating clock of the memory system 100 may be in the LFM or HFM. As shown in FIG. 2, in step S210, a command is transmitted from a memory controller of the memory system 100 to a memory device of the memory system 100. In step S220, when the operating clock is in the HFM, an LFM oscillator of the memory device of the memory system 100 is selected for obtaining a LFM delay according to the command. In step 230, when the operating clock is in the LFM, an HFM oscillator of the memory device of the memory system 100 is selected for obtaining a HFM delay according to the command.

In some embodiments, the LFM delay value is obtained before the operating clock is switched from the HFM to the LFM. In an embodiment, the LFM delay value is obtained by periodically enabling the LFM oscillator. In another embodiment, the LFM delay value is obtained by aperiodically enabling the LFM oscillator. The LFM delay value is applied for a LFM delay tracking when the operating clock is in the LFM.

In some embodiments, the HFM delay value is obtained before the operating clock is switched from the LFM to the HFM. In an embodiment, the HFM delay value is obtained by periodically enabling the HFM oscillator. In another embodiment, the HFM delay value is obtained by aperiodically enabling the HFM oscillator. The HFM delay value is applied for a HFM delay tracking when the operating clock is in the HFM.

In some embodiments, the LFM oscillator and the HFM oscillator are selected via Multipurpose Command (MPC) command or Mode Register Operand (MR OP).

In the tracking method of the invention, the memory device can obtain the HFM delay value or LFM delay value in advance. Therefore, when the memory device is switched from the LFM to the HFM, or switch from the HFM to the LFM, the memory device may not need to enable the HFM oscillator or LFM oscillator to obtain the HFM delay value or LFM delay value. The memory device can directly use the memory device HFM delay value or LFM delay value obtained in advance for delay tracking. Accordingly, in tracking method of the invention, the memory device can be operated more efficiently when the memory device is switched from the LFM to the HFM, or switch from the HFM to the LFM.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

It should be noted that although not explicitly specified, one or more steps of the methods described herein can include a step for storing, displaying and/or outputting as required for a particular application. In other words, any data, records, fields, and/or intermediate results discussed in the methods can be stored, displayed, and/or output to another device as required for a particular application. While the foregoing is directed to embodiments of the present invention, other and further embodiments of the invention can be devised without departing from the basic scope thereof. Various embodiments presented herein, or portions thereof, can be combined to create further embodiments. The above description is of the best-contemplated mode of carrying out the invention. This description is made for the purpose of illustrating the general principles of the invention and should not be taken in a limiting sense. The scope of the invention is best determined by reference to the appended claims.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A delay tracking method, applied to a memory system supporting a first mode and a second mode of an operating clock, comprising:
   selecting a first oscillator for obtaining a first delay value when the operating clock is in the second mode; and
   switching the operating clock from the second mode to the first mode.

2. The delay tracking method of claim 1, wherein the first oscillator is a low-frequency-mode (LFM) oscillator.

3. The delay tracking method of claim 1, wherein the first delay value is obtained by periodically enabling the first oscillator.

4. The delay tracking method of claim 1, wherein the first delay value is obtained by aperiodically enabling the first oscillator.

5. The delay tracking method of claim 1, wherein the first delay value is applied for delay tracking when the operating clock is in the first mode.

6. The delay tracking method of claim 1, wherein the first oscillator is selected via a Multipurpose Command (MPC) command or Mode Register Operand (MR OP).

7. A delay tracking method, applied to a memory system supporting a low-frequency-mode (LFM) and a high-frequency-mode (HFM) of an operating clock, comprising:
    selecting a HFM oscillator for obtaining a HFM delay value when the operating clock is in the LFM; and
    switching the operating clock from the LFM to the HFM.

8. The delay tracking method of claim 7, wherein the HFM delay value is obtained by periodically enabling the HFM oscillator.

9. The delay tracking method of claim 7, wherein the HFM delay value is obtained by aperiodically enabling the HFM oscillator.

10. The delay tracking method of claim 7, wherein the HFM delay value is applied for a HFM delay tracking when the operating clock is in the HFM.

11. The delay tracking method of claim 7, wherein the HFM oscillator is selected via Multipurpose Command (MPC) command or Mode Register Operand (MR OP).

12. A memory system supporting a low-frequency-mode (LFM) and a high-frequency-mode (HFM) of an operating clock, comprising:
    a memory controller, generating a command; and
    a memory device, comprising:
    a LFM oscillator; and
    a HFM oscillator,
    wherein the memory device receives the command from the memory controller to select the HFM oscillator, and
    wherein the HFM oscillator is selected for obtaining a HFM delay value when the operating clock is in the LFM.

13. The memory system of claim 12, wherein the HFM delay value is obtained by periodically enabling the HFM oscillator.

14. The memory system of claim 12, wherein the HFM delay value is obtained by aperiodically enabling the HFM oscillator.

15. The memory system of claim 12, wherein the HFM delay value is applied for HFM delay tracking when the operating clock is in the HFM.

16. The memory system of claim 12, wherein the HFM oscillator is selected via Multipurpose Command (MPC) command or Mode Register Operand (MR OP).

17. A memory system supporting a first mode and a second mode of an operating clock, comprising:
    a memory controller, generating a command; and
    a memory device, comprising:
    a first oscillator; and
    a second oscillator,
    wherein the memory device receives the command from the memory controller to select the first oscillator;
    wherein the first oscillator is selected for obtaining a first delay value when the operating clock is in the second mode.

18. The memory system of claim 17, wherein the first oscillator is a low-frequency-mode (LFM) oscillator and the second oscillator is a high-frequency mode (HFM) oscillator.

19. The memory system of claim 17, wherein the first delay value is applied for delay tracking when the operating clock is in the first mode.

20. The memory system of claim 17, wherein the first oscillator is selected via a Multipurpose Command (MPC) command or Mode Register Operand (MR OP).

* * * * *